(12) United States Patent
Liu et al.

(10) Patent No.: US 12,527,123 B2
(45) Date of Patent: Jan. 13, 2026

(54) MULTI-QUANTUM WELL STRUCTURE, LIGHT EMITTING DIODE AND LIGHT EMITTING COMPONENT

(71) Applicant: ENKRIS SEMICONDUCTOR, INC., Suzhou (CN)

(72) Inventors: Weihua Liu, Suzhou (CN); Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 380 days.

(21) Appl. No.: 18/302,232

(22) Filed: Apr. 18, 2023

(65) Prior Publication Data
US 2023/0261135 A1  Aug. 17, 2023

Related U.S. Application Data

(63) Continuation of application No. PCT/CN2020/129036, filed on Nov. 16, 2020.

(51) Int. Cl.
*H10H 20/812* (2025.01)
*H10H 20/825* (2025.01)
*H10H 29/14* (2025.01)

(52) U.S. Cl.
CPC ...... *H10H 20/812* (2025.01); *H10H 20/8252* (2025.01); *H10H 29/142* (2025.01)

(58) Field of Classification Search
CPC ............. H10H 20/812; H10H 20/8252; H10H 29/142; H10H 20/815
See application file for complete search history.

(56) References Cited

U.S. PATENT DOCUMENTS 9,632,422 B2   4/2017  Endres

FOREIGN PATENT DOCUMENTS

| CN | 1487603    A |   | 4/2004 |
|----|--------------|---|--------|
| CN | 101359710  A | * | 2/2009 |
| CN | 101359711  A |   | 2/2009 |
| CN | 101540364  A |   | 9/2009 |

(Continued)

OTHER PUBLICATIONS

International Search Report issued in corresponding PCT Application No. PCT/CN2020/129036, dated Jul. 26, 2021.

(Continued)

*Primary Examiner* — Mohammad A Rahman
(74) *Attorney, Agent, or Firm* — Westbridge IP LLC

(57) ABSTRACT

A multi-quantum well structure includes at least one lamination layer, each lamination layer includes a first film layer, an insertion layer and a second film layer, and the at least one lamination layer includes a plurality of lamination layers which are stacked with each other. The insertion layer is located between the first film layer and the second film layer. The insertion layer includes at least one of a monomer structure and a superlattice structure, the first film layer is doped with elements of In, Ga and N, the insertion layer is doped with elements of Al, Ga and N, and the second film layer is doped with elements of Ga and N. The multi-quantum well structure has ability to emit a light with a longer wavelength, and defects and other undesirable phenomena, caused by growing the first film layer with low-temperature epitaxy, may be prevented.

18 Claims, 3 Drawing Sheets

(56) References Cited

FOREIGN PATENT DOCUMENTS

| | | | |
|---|---|---|---|
| CN | 102280542 A | | 12/2011 |
| CN | 103500779 A | | 1/2014 |
| CN | 103681985 A | | 3/2014 |
| CN | 104505443 A | * | 4/2015 |
| CN | 109830580 A | | 5/2019 |
| EP | 2064751 A1 | | 6/2009 |
| JP | 2004031880 A | | 1/2004 |
| JP | 2011192833 A | | 9/2011 |
| WO | 2008030183 A1 | | 3/2008 |

OTHER PUBLICATIONS

Written Opinion issued in corresponding PCT Application No. PCT/CN2020/129036, dated Jul. 26, 2021.
First Office Action issued in counterpart Chinese Patent Application No. 202080106824.0, dated Apr. 26, 2025.

* cited by examiner

MULTI-QUANTUM WELL STRUCTURE, LIGHT EMITTING DIODE AND LIGHT EMITTING COMPONENT

CROSS-REFERENCE TO RELATED APPLICATIONS

The present application is a continuation application of International Application No. PCT/CN2020/129036, filed on Nov. 16, 2020, which is incorporated herein by reference in its entirety.

TECHNICAL FIELD

The present disclosure relates to the field of light emitting diode technologies, and in particular, to a multi-quantum well structure, a light emitting diode and a light emitting component.

BACKGROUND

As for a semiconductor Light Emitting Diode (LED), a composite radiation luminescence is carried out by using implanted electrons and holes in multi-quantum well. Accordingly, the higher the current implantation efficiency, the greater the probability of electron-hole compound radiation, and the higher the luminous efficiency of the LED.

However, with the limitation of a structure design of the existing multi-quantum well, luminous efficiency of electrons and holes in the multi-quantum well is limited, and a band gap width is hard to reduce, and therefore, it is difficult to realize a long-wavelength luminescence.

SUMMARY

In a multi-quantum well structure, a luminous film layer is doped with an element of In, so that a band gap width can be reduced, thus emitting a long-wavelength light. Therefore, whether the long-wavelength light can be emitted by a luminous film layer and intensity (e.g., flux, etc.) of a light emitted by the luminous film layer are limited by doped efficiency of the element of In. The element of In may be doped into the film layer by using a method for lowering an epitaxial temperature. However, with the decrease of the epitaxial temperature, a probability of film defects in the multi-quantum well may increase sharply, and even the multi-quantum well structure may not have ability to effectively emit the light.

In view of this, embodiments of the present disclosure relate to a multi-quantum well structure, a light emitting diode and a light emitting component, which are able to solve the above technical problems.

One aspect of the present disclosure provides a multi-quantum well structure, including at least one lamination layer, each lamination layer including a first film layer, an insertion layer and a second film layer. The insertion layer is located between the first film layer and the second film layer. The insertion layer includes at least one of a monomer structure and a superlattice structure. The first film layer is doped with elements of In, Ga and N, the insertion layer is doped with elements of Al, Ga and N, and the second film layer is doped with elements of Ga and N.

For example, in the multi-quantum well structure provided by an embodiment of the first aspect of the present disclosure, a band gap width of the insertion layer is greater than band gap widths of the first film layer and the second film layer.

In an embodiment of the present disclosure, for example, the first film layer may be a potential well layer (e.g., a quantum well), the second film layer may be a potential barrier layer (e.g., a quantum barrier), and the insertion layer may be an insertion layer. In each lamination layer, for example, the first film layer, the insertion layer and the second film layer are sequentially formed (e.g., grown), that is, the insertion layer is grown on the first film layer, and then the second film layer is grown on the insertion layer.

After inserting the insertion layer between the first layer and second film layer, there are differences between the insertion layer doped with the elements of Al, Ga and N and the first film layer doped with the elements of In, Ga and N in terms of the band gap width and a lattice constant, which may form a strong built-in electric field in the first film layer. Under the condition that there is a forward bias, an actual conduction band energy level of the first film layer bends down and the band gap width becomes narrow. In this way, compared with the case where no insertion layer is provided, the first film layer has ability to emit a light with a longer wavelength, and in this process, the first film layer may be grown without low-temperature epitaxy, thus preventing defects and other undesirable phenomena caused by growing the first film layer with the low-temperature epitaxy.

In addition, as for the multi-quantum well structure in the above solutions, a lattice size of the first film layer doped with the elements of In, Ga and N and that of the second film layer doped with the elements of Ga and N are significantly different without arrangement of the insertion layer, so that a crystal quality of the multi-quantum well structure is poor, resulting in significantly low Well Proximity Effect (WPE), and even the multi-quantum well structure cannot have ability to emit the light effectively. After the insertion layer is inserted between the first film layer and the second film layer, lattice differences between the first film layer and the insertion layer, and between the insertion layer and the second film layer are less, for example, the lattice differences between the first film layer and the insertion layer, and between the insertion layer and the second film layer are less than that between the first film layer and the second film layer.

For example, in the multi-quantum well structure provided in the first aspect of the present disclosure, a material of the insertion layer includes GaN and AlGaN.

For example, in the multi-quantum well structure provided in the first aspect of the present disclosure, based on two materials of the GaN and the AlGaN included in the insertion layer, a superlattice structure is formed in the insertion layer.

The superlattice structure (SLs) is formed by the GaN and the AlGaN in the insertion layer, which can provide better carrier implantation efficiency compared with where the insertion layer is only made of the AlGaN, thus improving overall luminous efficiency of the multi-quantum well structure.

For example, in the multi-quantum well structure provided in the first aspect of the present disclosure, the insertion layer is further doped with an element of In, and the material of the insertion layer further includes InAlGaN. For example, the material of the insertion layer includes the GaN and InAlGaN.

For example, in the multi-quantum well structure provided in the first aspect of the present disclosure, based on two materials of the GaN and the InAlGaN included in the insertion layer, a superlattice structure is formed in the insertion layer.

Since the insertion layer is doped with the element of In, it is possible to suppress point defects and reduce a stress between films as the insertion layer is being epitaxial grown, thus further improving a quality and luminous efficiency of the multi-quantum well structure, and suppressing separation and precipitation of the element of In (e.g., the element of In in the potential well layer).

For example, in the multi-quantum well structure provided by some embodiments of the first aspect of the present disclosure, along a direction from the first film layer to the second film layer, a composition content of an element of Al in the insertion layer gradually increases. The multi-quantum well structure in this solution may have functions of emitting a light with a longer electroluminescent wavelength.

For example, in the multi-quantum well structure provided by some embodiments of the first aspect of the present disclosure, the insertion layer includes a monomer structure made of the AlGaN, and a composition proportion of an element of Al in the monomer structure made of the AlGaN ranges from 0.5% to 30%.

For example, in the multi-quantum well structure provided by some other embodiments of the first aspect of the present disclosure, the insertion layer includes a monomer structure made of the AlInGaN, and a composition proportion of an element of Al in the monomer structure made of the AlInGaN ranges from 0.5% to 30%.

For example, in the multi-quantum well structure provided by some other embodiments of the first aspect of the present disclosure, the insertion layer includes a superlattice structure made of the AlGaN and the GaN, and a composition proportion of an element of Al in the superlattice structure ranges from 0.5% to 30%.

For example, in the multi-quantum well structure provided by some other embodiments of the first aspect of the present disclosure, the insertion layer includes a superlattice structure made of the AlInGaN and the GaN, and a composition proportion of an element of Al in the superlattice structure ranges from 0.5% to 30%.

For example, in the multi-quantum well structure provided by some other embodiments of the first aspect of the present disclosure, along a direction from the first film layer to the second film layer, a composition content of the element of Al in the insertion layer gradually decreases. the multi-quantum well structure in this solution may have functions of emitting a light with a shorter electroluminescent wavelength.

For example, in the multi-quantum well structure provided by some embodiments of the first aspect of the present disclosure, a thickness of the insertion layer ranges from 0.2 nm to 5 nm.

For example, in the multi-quantum well structure provided by some embodiments of the first aspect of the present disclosure, the insertion layer is a single-layer structure comprising the monomer structure or the superlattice structure.

For example, in the multi-quantum well structure provided by some other embodiments of the first aspect of the present disclosure, the insertion layer is a multi-layer structure comprising at least one of the monomer structure and the superlattice structure, which may improve luminous efficiency of the multi-quantum well.

For example, in the multi-quantum well structure provided by the embodiment of the first aspect of the present disclosure, the insertion layer is N-doped or P-doped.

For example, in the multi-quantum well structure provided by the first aspect of the present disclosure, the at least one lamination layer includes a plurality of lamination layers which are stacked with each other.

A second aspect of the present disclosure provides a light emitting diode including the multi-quantum well structure as mentioned in any embodiment of the first aspect.

For example, the light emitting diode provided in the second aspect of the present disclosure further includes a substrate, an N-type layer and a P-type layer. The N-type layer is located on the substrate, and the P-type layer is located on one side, away from the substrate, of the N-type layer. The multi-quantum well structure is located between the N-type layer and the P-type layer, and in a direction from the N-type layer to the P-type layer, the first film layer, the insertion layer and the second film layer in each lamination layer are arranged in sequence.

A third aspect of the present disclosure provides a light emitting component including at least one first light emitting diode emitting a first-color light and at least one second light emitting diode emitting a second-color light. A wavelength of the first-color light is less than that of the second-color light, and the at least one second light emitting diode is the light emitting diode as mentioned in the embodiments of the second aspect. For example, in some embodiments of the third aspect of the present disclosure, the first color light may be a blue light or a green light, and the second-color light may be a yellow light or a red light.

BRIEF DESCRIPTION OF THE DRAWINGS

In order to more clearly explain the embodiments of the present disclosure or the technical solutions in the prior art, the drawings needed in the description of the embodiments or the prior art may be briefly introduced below. Obviously, the drawings in the following description are only some of the embodiments recorded in the present disclosure, and based on these drawings, other drawings may be obtained by those of ordinary skill in the art in the field without creative work.

DETAILED DESCRIPTIONS OF THE EMBODIMENTS

Figure 1:
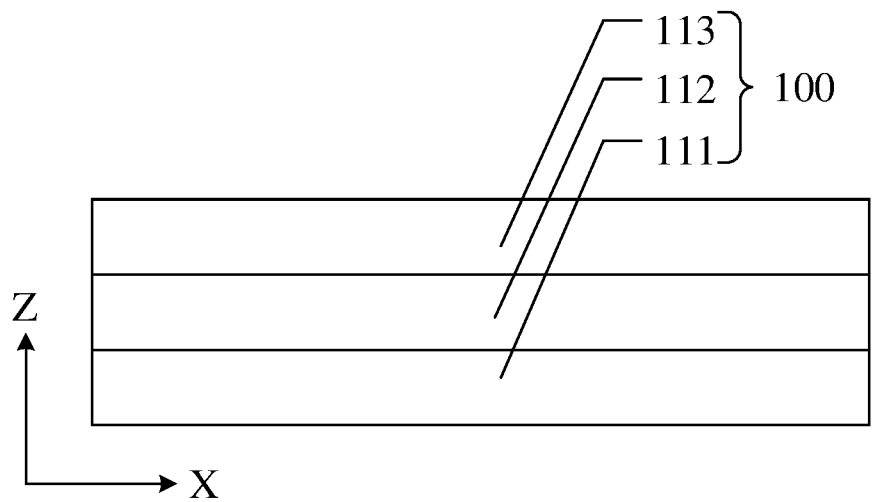
FIG. 1 is a schematic cross-sectional diagram of a multi-quantum well structure according to an embodiment of the present disclosure.

In the following, the technical solutions in the embodiments of the present disclosure may be clearly and completely described with reference to the attached drawings. Obviously, the described embodiments are only a part of the embodiments of the present disclosure rather than all the embodiments. Based on the embodiments in the present disclosure, all other embodiments obtained by those of ordinary skill in the art in the field without creative work fall within the scope of protection of the present disclosure.

In a process of manufacturing a luminous film layer (e.g. a potential well layer) in a multi-quantum well with a low epitaxial temperature, due to the low epitaxial temperature, Not Intentionally Doped (NID), caused by impurities such as an element of C, increases in a process of epitaxial growth of the potential well layer, and a lateral epitaxial rate of the potential well layer decreases due to the low temperature, which facilitates formation of point and line dislocations. With the epitaxial growth continues, V-shaped pits may be formed, resulting in defects in the film layer in the multi-quantum well. In view of this, embodiments of the present disclosure relate to a multi-quantum well structure, a light emitting diode and a light emitting component, which may solve the above technical problems.

Embodiments of the present disclosure provide a multi-quantum well structure, including at least one lamination layer, and each lamination layer includes a first film layer, an insertion layer and a second film layer. The insertion layer is located between the first film layer and the second film layer. The insertion layer includes at least one of a monomer structure and a superlattice structure. The first film layer is doped with elements of In, Ga and N, the insertion layer is doped with elements of Al, Ga and N, and the second film layer is doped with elements of Ga and N. In this way, in terms of a band gap width and a lattice constant, there are differences between the insertion layer doped with the elements of Al, Ga and N and the first film layer doped with the elements of In, Ga and N, which may form a strong built-in electric field in the first film layer. Under the condition that there is a forward bias, an actual conduction band energy level of the first film layer bends down and the band gap width becomes narrow. In this way, compared with the case where no insertion layer is provided, the first film layer has ability to emit a light with a longer wavelength, and in this process, the first film layer may be grown without low-temperature epitaxy, thus preventing defects and other undesirable phenomena caused by growing the first film layer with the low-temperature epitaxy.

Next, a multi-quantum well structure, a light emitting diode and a light emitting component according to at least one embodiment of the present disclosure may be described in detail with reference to the drawings. In these drawings, a spatial rectangular coordinate system is established based on a plane where the first film layer is located, to directionally explain a position of each film layer in the multi-quantum well structure, the light emitting diode and the light emitting component. In this spatial rectangular coordinate system, an X axis and a Y axis are parallel to the plane where the first film layer is located, and a Z axis is perpendicular to the plane where the first film layer is located.

In the embodiment of the present disclosure, as shown in FIG. 1, the multi-quantum well structure includes a lamination layer 100, including a first film layer 111, an insertion layer 112 and a second film layer 113 that are sequentially stacked. The first film layer 111 is doped with the elements of In, Ga and N, for example, a material of the first film layer 111 is InGaN; the insertion layer 112 is doped with the elements of Al, Ga and N, for example, a material of the insertion layer 112 is AlGaN; and the second film layer 113 is doped with the elements of Ga and N, for example, a material of the second film layer 113 is GaN. The insertion layer 112 includes at least one of a monomer structure and a superlattice structure, both of which are doped with the elements of Al, Ga and N. For example, the insertion layer 112 may be composed of at least one of the monomer structure and the superlattice structure.

For example, in the embodiment of the present disclosure, as shown in FIG. 1, the first film layer 111 is a potential well layer, the second film layer 113 is a potential barrier layer. In a process of producing the lamination layer 100, after the first film layer 111 is formed, the insertion layer 112 is grown on the first film layer 111, and then the second film layer 113 is grown on the insertion layer 112.

Furthermore, as for the lamination layer 100 shown in FIG. 1, the first film layer 111 is in contact with the second film layer 113 without arrangement of the insertion layer 112. However, a lattice size of the first film layer 111 doped with the elements of In, Ga and N and that of the second film layer 113 doped with the elements of Ga and N are significantly different, so that a crystal quality of the lamination layer 100 is poor, resulting in significantly low Well Proximity Effect, and even the lamination layer 100 cannot have ability to emit a light effectively. As shown in FIG. 1, after the insertion layer 112 is inserted between the first film layer 111 and the second film layer 113, lattice differences between the first film layer 111 and the insertion layer 112, and between the insertion layer 112 and the second film layer 113 are less, thereby improving the crystal quality of the lamination layer 100.

In the embodiment of the present disclosure, as long as the insertion layer may be doped with the elements of Al, Ga and N, on this basis, a specific material, formed by the elements Al, Ga and N, of the insertion layer is not limited, and there is no restriction on whether the insertion layer is doped with other elements to form other materials, which may be specifically selected according to needs of an actual process. For example, in some embodiments, the elements of Al, Ga and N doped in the insertion layer may be used only to form the AlGaN. For example, in other embodiments, the elements of Al, Ga and N doped in the insertion layer may be used to form the AlGaN and the GaN. For example, in some other embodiments, the insertion layer may be doped with other elements (such as the element of In) to form other types of materials, other than the AlGaN and the GaN, with the elements Al, Ga and N. In the following, by several specific examples, the multi-quantum well structure with several different types of the insertion layer may be explained.

For example, in some embodiments of the present disclosure, the insertion layer is only doped with the elements of Al, Ga and N, and the elements of Al, Ga and N are only formed as the AlGaN, that is, the insertion layer is a single AlGaN material layer.

For example, in other embodiments of the present disclosure, the insertion layer is only doped with the elements of Al, Ga and N. The elements of Al, Ga and N are used to form two materials of the GaN and the AlGaN, and based on the two materials of the GaN and the AlGaN, the superlattice structure is formed. In this way, based on the two materials of the GaN and the AlGaN in the insertion layer, the superlattice structure (SLs) may be formed in the insertion layer. Compared with the case where the material of the insertion layer is only the AlGaN, the superlattice structure is a periodic structure, and correspondingly, a conduction band and a valence band energy level are also periodic. In a doping process, the conduction band or the valence band energy level corresponding to this structure may overlap with a unified Fermi energy level, which is beneficial to improving a carrier concentration, thus providing better carrier injection efficiency and improving overall luminous efficiency of the multi-quantum well structure.

For example, in the embodiment of the present disclosure, when the insertion layer is doped with the AlGaN, along a direction from the first film layer to the second film layer, a composition content of the element of Al in the material of the AlGaN gradually increases, so that the multi-quantum well structure may have functions of emitting a light with a longer electroluminescent wavelength, and in this case, with the increase of an implantation current, its luminescent wavelength presents less blue shift. Alternatively, a composition content of the element of Al in the material of the AlGaN decreases gradually, so that the multi-quantum well structure may have functions of emitting a light with a shorter electroluminescent wavelength, and in this case, with the increase of the implantation current, its luminescent wavelength presents more blue shift. In this embodiment, the "composition content" is a percentage of the number of atoms in the material.

In the embodiment of the present disclosure, for example, in the case where the material of the insertion layer is the AlGaN, the composition proportion of the element of Al in the material of the AlGaN ranges from 0.2% to 50%, and further ranges from 0.5% to 30%.

For example, in other embodiments of the present disclosure, the insertion layer is further doped with the element of In, and the insertion layer is further made of the material of the InAlGaN. For example, the insertion layer is made of the two materials of the GaN and the InAlGaN, and based on the two materials of the GaN and the InAlGaN, the superlattice structure may be formed. In this way, since the insertion layer is doped with the element of In, it is possible to suppress the point defects and reduce the stress between films as the insertion layer (e.g., made of the AlGaN) is being epitaxial grown, thus further improving the quality and the luminous efficiency of the multi-quantum well structure and suppressing the separation and precipitation of the element of In (for example, the element of In in the potential well layer).

For example, in the multi-quantum well structure provided by some embodiments of the present disclosure, the insertion layer includes the monomer structure made of the AlGaN, and a composition proportion of an element of Al in the monomer structure made of the AlGaN ranges from 0.5% to 30%. For example, the composition proportion of the element of Al is gradually changing in a range of 0.5% to 30%.

For example, in the multi-quantum well structure provided by some other embodiments of the present disclosure, the insertion layer includes the monomer structure made of the AlInGaN, and a composition proportion of an element of Al in the monomer structure made of the AlInGaN ranges from 0.5% to 30%. For example, the composition proportion of the element of Al is gradually changing in a range of 0.5% to 30%.

For example, in the multi-quantum well structure provided by some other embodiments of the present disclosure, the insertion layer includes the superlattice structure made of the AlGaN and the GaN, and a composition proportion of an element of Al in the superlattice structure ranges from 0.5% to 30%. For example, the composition proportion of the element of Al is gradually changing in a range of 0.5% to 30%.

For example, in the multi-quantum well structure provided by some other embodiments of the present disclosure, the insertion layer includes the superlattice structure made of the AlInGaN and the GaN, and a composition proportion of an element of Al in the superlattice structure ranges from 0.5% to 30%. For example, the composition proportion of the element of Al is gradually changing in a range of 0.5% to 30%.

Without the arrangement of the insertion layer, a thickness of the first film layer is usually between 1 nm and 4 nm, and a thickness of the second film layer is usually between 3 nm and 20 nm. In the embodiment of the present disclosure, in the case of where the composition content of the element of Al in the insertion layer is gradually changing (e.g., gradually increasing or decreasing), and/or the insertion layer is set to be the superlattice structure, a thickness of the insertion layer may be between 0.2 nm and 5 nm.

In the multi-quantum well structure provided by some embodiments of the present disclosure, for example, the insertion layer is a single-layer structure comprising the monomer structure or the superlattice structure. For example, the insertion layer is a film layer made of the AlGaN or the AlInGaN.

In the multi-quantum well structure provided by other embodiments of the present disclosure, for example, the insertion layer is a multi-layer structure comprising at least one of the monomer structure and the superlattice structure. For example, the insertion layer includes a plurality of film layers made of the AlGaN, or a plurality of film layers made of the AlInGaN, or a film layer made of the AlGaN and a film layer made of the AlInGaN, which may improve the luminous efficiency of the multi-quantum well. For example, in the case where the insertion layer includes both the film layer made of the AlGaN and the film layer made of the AlInGaN, the film layer made of the AlGaN may include a plurality of film layers made of the AlGaN, the film layer made of the AlInGaN may include a plurality of film layers made of the AlInGaN, and the plurality of film layers made of the AlGaN and the plurality of film layers made of the AlInGaN are alternately stacked with each other, which may further improve the luminous efficiency of the multi-quantum well.

Figure 2:
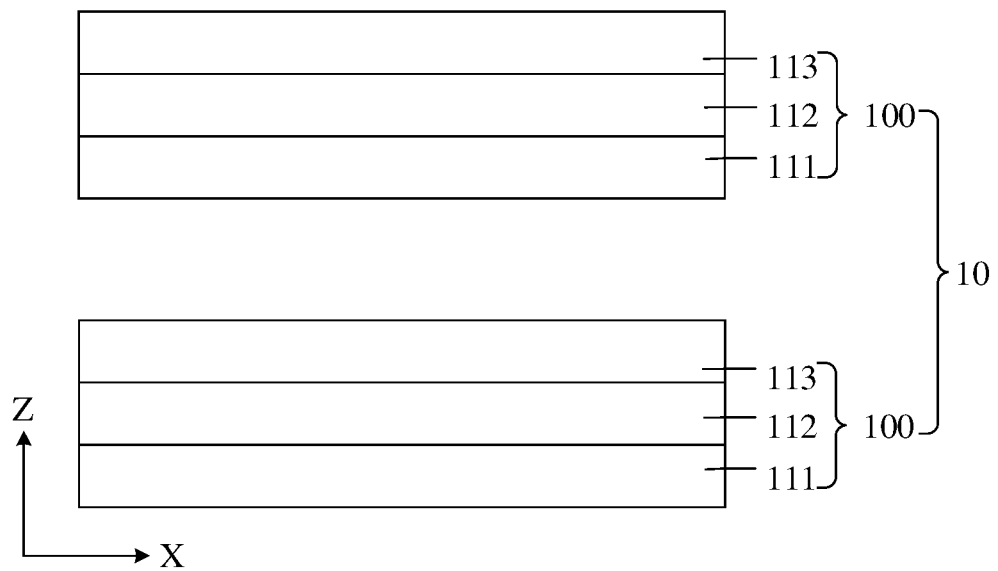
FIG. 2 is a schematic cross-sectional diagram of another multi-quantum well structure according to an embodiment of the present disclosure.

For example, in the multi-quantum well structure provided by the embodiment of the present disclosure, the at least one lamination layer includes a plurality of lamination layers which are stacked with each other. Illustratively, as shown in FIG. 2, the plurality of lamination layers 100 are stacked with each other. For example, the multi-quantum well structure may include at least ten lamination layers, and different lamination layers are stacked with each other. As another example, the multi-quantum well structure may include at least twenty lamination layers.

For example, in the multi-quantum well structure provided by the embodiment of the present disclosure, the insertion layer may be N-doped or P-doped, thereby improving the luminous efficiency of the multi-quantum well structure.

An embodiment of the present disclosure provides a light emitting diode including the multi-quantum well structure mentioned in any of the above embodiments.

Figure 3:
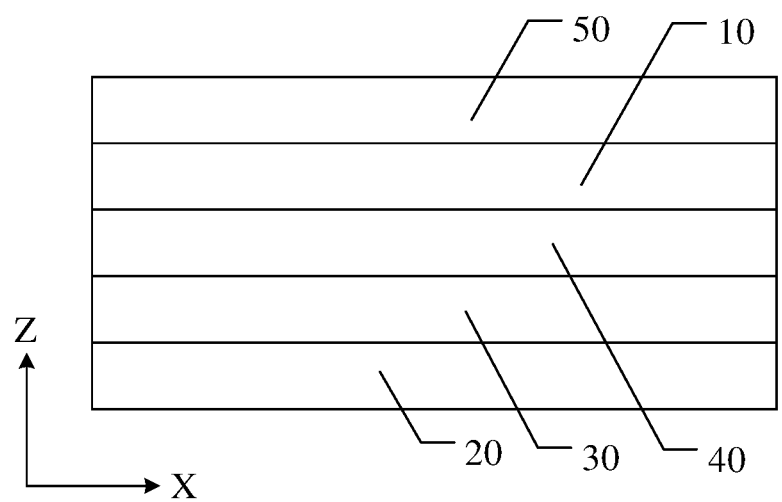
FIG. 3 is a schematic cross-sectional diagram of a light emitting diode according to an embodiment of the present disclosure.

For example, in the light emitting diode provided by the embodiment of the present disclosure, as shown in FIG. 3, the light emitting diode includes the multi-quantum well structure 10, a substrate 20, an N-type layer 40 and a P-type layer 50. The N-type layer 40, the multi-quantum well structure 10 and the P-type layer 50 are sequentially stacked on the substrate 20. Along a direction from the N-type layer 40 to the P-type layer 50, the first film layer, the insertion layer and the second film layer in each lamination layer are arranged in sequence. The N-type layer 40 may be an N-type GaN film layer, and the P-type layer 50 may be a P-type GaN film layer.

For example, the substrate 20 may be a sapphire substrate, a GaN-based substrate, a Si-based substrate, a SiN-based substrate, a glass substrate, or the like.

For example, in the light emitting diode provided by the embodiment of the present disclosure, a plurality of grooves may be disposed in the N-type layer, and at least one of a DBR (Distributed Bragg Reflector) structure and a photonic crystal structure may be disposed in the grooves. Based on the at least one of the DBR structure and the photonic crystal structure, a light in a specific wavelength range may be filtered, thus improving a monochromatic degree of a light emitted by the light emitting diode. The DBR structure is made of at least two kinds of semiconductor materials or dielectric materials grown alternately. Based on the DBR structure, high reflectivity can be obtained for waves in a specific frequency range (equivalent to a light in a specific wavelength range). A photonic crystal is composed of a periodic dielectric structure with Photonic Band-Gap (PBG) characteristics. In this periodic structure, waves cannot propagate in a certain frequency range.

For example, in the light emitting diode provided by the embodiment of the present disclosure, the light emitting diode may further include a U-type layer. Illustratively, as shown in FIG. 3, the U-type layer 30 is located between the N-type layer 40 and the substrate 20. For example, the U-type layer 30 may be a U-type GaN film layer.

For example, in the embodiment of the present disclosure, the light emitting diode may further include a buffer layer located between the substrate and the N-type layer 40. For example, a material of the buffer layer may include one or a combination of AlN, GaN, AlGaN and InGaN. Based on the buffer layer, the stress, generated when an epitaxial layer is grown on the silicon substrate, may be significantly relieved, and dislocation filtering is realized, thus improving a crystal quality of the epitaxial layer. For example, the buffer layer may also be used as a planarization layer. When the buffer layer is formed on the substrate, a surface, on which the substrate is located, of the light emitting diode is planarized, which improves planarization of the following prepared layers such as the N-type layer, the film layers in the multi-quantum well structure and the P-type layer, to ensure yield of the light emitting diode.

An embodiment of the present disclosure provides a light emitting component, including at least one first light emitting diode emitting a first-color light and at least one second light emitting diode emitting a second-color light. A wavelength of the first-color light is less than that of the second-color light, and the second light emitting diode is the light emitting diode mentioned in the above embodiments. For example, the first-color light may be a blue light, a green light, or the like, and the second-color light may be a yellow light, a red light, or the like. For example, the light emitting component may include light emitting diodes emitting lights of multiple colors, and adjacent light emitting diodes that emit the lights with different colors are combined into a unit, so that a white light, a colored light and lights with other colors may be selected to be emit as required based on the unit. As another example, the light emitting component may be used in a display field, and the unit may be used as a display unit (equivalent to a pixel) for displaying images.

Figure 4:
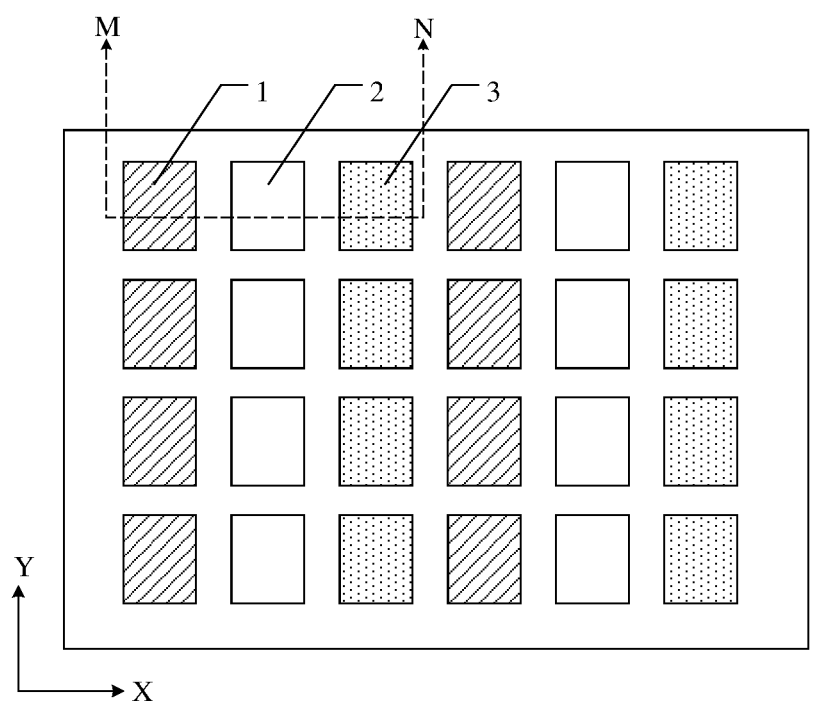
FIG. 4 is a schematic plan diagram of a light emitting component according to an embodiment of the present disclosure.
Figure 5:
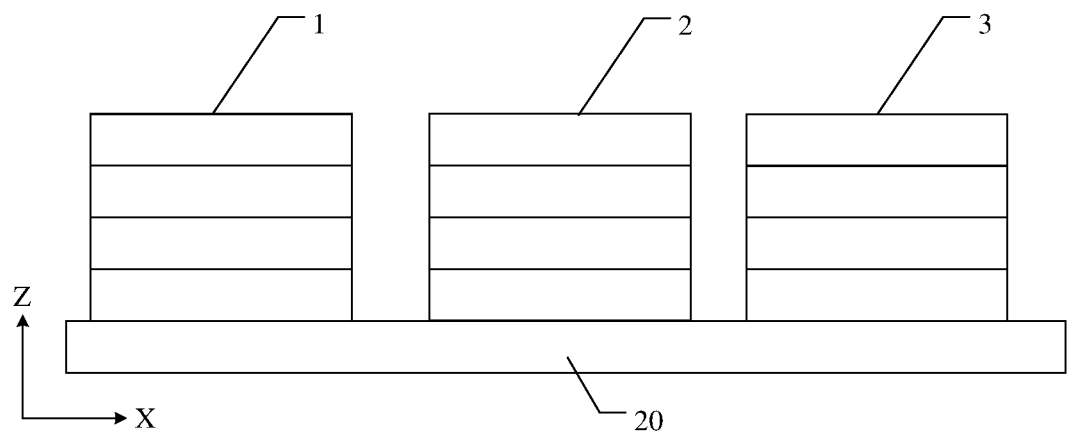
FIG. 5 is a cross-sectional diagram of the light emitting component of FIG. 4 taken along a line M-N.

For example, in an embodiment of the present disclosure, the light emitting component may be a display panel. Illustratively, as shown in FIG. 4 and FIG. 5, the light emitting component includes three types of light emitting diodes 1, 2 and 3. The light emitting diodes 1, 2 and 3 are set to emit three lights with different colors (for example, red, green and blue), respectively. Adjacent light emitting diodes 1, 2 and 3 are used as a whole, which is served as a display unit (e.g., a pixel), and the light emitting diodes 1, 2 and 3 are served as sub-pixels, respectively.

For example, in the embodiment of the present disclosure, a plane area of the first light emitting diode is less than that of the second light emitting diode. Illustratively, the display unit of the light emitting component includes three light emitting diodes 1, 2 and 3 emitting a red light, a green light and a blue light respectively, and a design area of the light emitting diode 1 is greater than design areas of the light emitting diodes 2 and 3. Due to a limited ability of the light emitting diode to emit a light with a long-wavelength (such as a red light) and a phenomenon of the blue shift of light emission when current intensity is increased, the plane area of the light emitting diode, emitting the light with the long-wavelength, is designed to be large, which may reduce requirements of the current intensity and a degree of the blue shift of the emitted light while ensuring brightness of the light with the long-wavelength.

Figure 6:
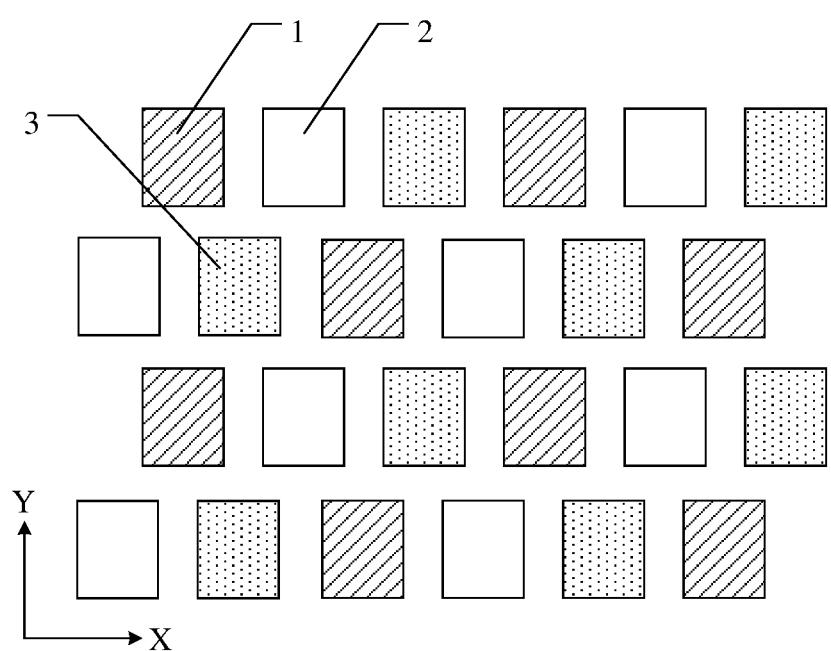
FIG. 6 is a schematic plan diagram of another light emitting component according to an embodiment of the present disclosure.

It should be noted that in the embodiment of the present disclosure, there are no restriction on the number of light emitting diodes (or the number of colors of the emitted light) included in each display unit of the light emitting component and the arrangement of the plurality of light emitting diodes included in each display unit of the light emitting component. For example, as shown in FIG. 5, the light emitting diodes 1, 2 and 3 in each display unit are arranged in a row/column; alternatively, as shown in FIG. 6, the light emitting diodes 1, 2 and 3 in each display unit are arranged in a triangle.

In the embodiment of the present disclosure, the light emitting component (e.g., the display panel) may be used in the field of AR or VR display. For example, the light emitting component is used for AR glasses, which include optical waveguide lenses and optical components. The light emitted by the light emitting component (equivalent to a displayed image) is entered into the optical waveguide lenses after passing through the optical components (e.g., including a magnifying glass, etc.), and then the light is introduced into the human eyes by the optical waveguide lenses, and at the same time, the human eyes may observe images of a surrounding environment through the optical waveguide lenses, so that the displayed image observed by the human eyes are projected into an environmental image, to realize augmented reality display. In the embodiment of the present disclosure, as for the light emitting diode emitting the light with the long-wavelength (such as the red light), after the multi-quantum well structure in the above embodiments of the present disclosure is applied in the light emitting diode emitting the light with the long-wavelength, the blue shift may be reduced or the degree of the blue shift may be lowered when the light is emitted by the light emitting diode, thus improving display effect of the light emitting component.

The above are only the preferred embodiments of this disclosure, and is not used to limit this disclosure. Any modification and equivalent substitution made within the spirit and principle of this disclosure should be included in the protection scope of this disclosure.

What is claimed is:

1. A multi-quantum well structure, comprising at least one lamination layer, each lamination layer comprising a first film layer, an insertion layer and a second film layer, wherein
the at least one lamination layer comprises a plurality of lamination layers which are stacked with each other, and the insertion layer is located between the first film layer and the second film layer; and the insertion layer comprises at least one of a monomer structure and a superlattice structure, the first film layer is doped with elements of In, Ga and N, the insertion layer is doped with elements of Al, Ga and N, and the second film layer is doped with elements of Ga and N; wherein, along a direction from the first film layer to the second film layer, a composition content of the element of Al in the insertion layer gradually increases or decreases.

2. The multi-quantum well structure of claim 1, wherein a material of the insertion layer comprises at least one of AlGaN and AlInGaN.

3. The multi-quantum well structure of claim 1, wherein the insertion layer comprises the monomer structure made of AlGaN, and a composition proportion of an element of Al in the monomer structure made of the AlGaN ranges from 0.5% to 30%; or the insertion layer comprises the monomer structure made of AlInGaN, and a composition proportion of an element of Al in the monomer structure made of the AlInGaN ranges from 0.5% to 30%; or
the insertion layer comprises the superlattice structure made of AlGaN and GaN, and a composition proportion of an element of Al in the superlattice structure ranges from 0.5% to 30%; or
the insertion layer comprises the superlattice structure made of AlInGaN and GaN, and a composition proportion of an element of Al in the superlattice structure ranges from 0.5% to 30%.

4. The multi-quantum well structure of claim 1, wherein a thickness of the insertion layer ranges from 0.2 nm to 5 nm.

5. The multi-quantum well structure of claim 1, wherein the insertion layer is a single-layer structure comprising the monomer structure or the superlattice structure; and/or
the insertion layer is a multi-layer structure comprising at least one of the monomer structure and the superlattice structure.

6. The multi-quantum well structure of claim 1, wherein the insertion layer is N-doped or P-doped.

7. The multi-quantum well structure of claim 1, wherein a band gap width of the insertion layer is greater than band gap widths of the first film layer and the second film layer.

8. A light emitting diode, comprising a multi-quantum well structure, comprising: at least one lamination layer, each lamination layer comprising a first film layer, an insertion layer and a second film layer, wherein
the at least one lamination layer comprises a plurality of lamination layers which are stacked with each other, and the insertion layer is located between the first film layer and the second film layer; and
the insertion layer comprises at least one of a monomer structure and a superlattice structure, the first film layer is doped with elements of In, Ga and N, the insertion layer is doped with elements of Al, Ga and N, and the second film layer is doped with elements of Ga and N; wherein, along a direction from the first film layer to the second film layer, a composition content of the element of Al in the insertion layer gradually increases or decreases.

9. The light emitting diode of claim 8, wherein a material of the insertion layer comprises at least one of AlGaN and AlInGaN.

10. The light emitting diode of claim 8, wherein the insertion layer comprises the monomer structure made of AlGaN, and a composition proportion of an element of Al in the monomer structure made of the AlGaN ranges from 0.5% to 30%; or the insertion layer comprises the monomer structure made of AlInGaN, and a composition proportion of an element of Al in the monomer structure made of the AlInGaN ranges from 0.5% to 30%; or
the insertion layer comprises the superlattice structure made of AlGaN and GaN, and a composition proportion of an element of Al in the superlattice structure ranges from 0.5% to 30%; or
the insertion layer comprises the superlattice structure made of AlInGaN and GaN, and a composition proportion of an element of Al in the superlattice structure ranges from 0.5% to 30%.

11. The light emitting diode of claim 8, wherein a thickness of the insertion layer ranges from 0.2 nm to 5 nm.

12. The light emitting diode of claim 8, wherein the insertion layer is a single-layer structure comprising the monomer structure or the superlattice structure; and/or
the insertion layer is a multi-layer structure comprising at least one of the monomer structure and the superlattice structure.

13. The light emitting diode of claim 8, wherein the insertion layer is N-doped or P-doped.

14. The light emitting diode of claim 8, wherein a band gap width of the insertion layer is greater than band gap widths of the first film layer and the second film layer.

15. The light emitting diode of claim 8, further comprising:
a substrate;
an N-type layer located on the substrate; and
a P-type layer located on one side, away from the substrate, of the N-type layer, wherein the multi-quantum well structure is located between the N-type layer and the P-type layer, and in a direction from the N-type layer to the P-type layer, the first film layer, the insertion layer and the second film layer in each lamination layer are arranged in sequence.

16. A light emitting component, comprising at least one first light emitting diode emitting a first-color light and at least one second light emitting diode emitting a second-color light, wherein
a wavelength of the first-color light is less than that of the second-color light, and the at least one second light emitting diode comprises: at least one lamination layer, each lamination layer comprising a first film layer, an insertion layer and a second film layer;
the at least one lamination layer comprises a plurality of lamination layers which are stacked with each other, and the insertion layer is located between the first film layer and the second film layer; and
the insertion layer comprises at least one of a monomer structure and a superlattice structure, the first film layer is doped with elements of In, Ga and N, the insertion layer is doped with elements of Al, Ga and N, and the second film layer is doped with elements of Ga and N.

17. The light emitting component of claim 16, wherein a material of the insertion layer comprises at least one of AlGaN and AlInGaN.

18. The light emitting component of claim 16, wherein the at least one second light emitting diode further comprises:
a substrate;
an N-type layer located on the substrate; and
a P-type layer located on one side, away from the substrate, of the N-type layer, wherein
the multi-quantum well structure is located between the N-type layer and the P-type layer, and in a direction from the N-type layer to the P-type layer, the first film layer, the insertion layer and the second film layer in each lamination layer are arranged in sequence.

* * * * *